(12) United States Patent
MacCormack

(10) Patent No.: US 6,327,683 B1
(45) Date of Patent: Dec. 4, 2001

(54) DEVICE SCAN TESTING

(75) Inventor: Andrew MacCormack, Bristol (GB)

(73) Assignee: STMicroelectronics Limited, Bristol (GB)

( * ) Notice: Subject to any disclaimer, the term of this patent is extended or adjusted under 35 U.S.C. 154(b) by 0 days.

(21) Appl. No.: 09/240,225

(22) Filed: Jan. 29, 1999

(30) Foreign Application Priority Data

Jan. 30, 1998 (GB) .................................................. 9802091

(51) Int. Cl.⁷ .................................................. G01R 31/28
(52) U.S. Cl. .................................................. 714/726
(58) Field of Search .................................. 714/726–733; 326/16

(56) References Cited

U.S. PATENT DOCUMENTS

| | | | |
|---|---|---|---|
| 5,258,985 | * 11/1993 | Spence et al. | 714/732 |
| 5,299,136 | 3/1994 | Babakanian et al. | 716/4 |
| 5,428,622 | * 6/1995 | Kuban et al. | 714/729 |
| 5,642,362 | * 6/1997 | Savir | 714/726 |

FOREIGN PATENT DOCUMENTS

| | | | |
|---|---|---|---|
| 0 489 394 A2 | 6/1992 | (EP) | G01R/31/318 |
| 03185696 | 8/1991 | (JP) | G11C/11/41 |
| 93/18457 | 9/1993 | (WO) | G06F/11/26 |

* cited by examiner

*Primary Examiner*—Albert DeCady
*Assistant Examiner*—Shelly A Chase
(74) *Attorney, Agent, or Firm*—Lisa K. Jorgenson; David V. Carlson; Seed IP Law Group PLLC

(57) ABSTRACT

A circuit and method for scan testing some or all connections to a device, the device under test having at least one output and a plurality of inputs greater than the number of outputs. Such a device typically includes built-in self-test capability. An exclusive-OR gate receives the plurality of inputs and generates an exclusive-OR output. A multiplexer receives the at least one data output and the exclusive-OR as respect inputs, and selectively outputs one of such as a data output. Such selection of the output of the multiplexer is controlled responsive to a scan test signal, the exclusive-OR output being output from the multiplexer in a scan test.

10 Claims, 3 Drawing Sheets

DEVICE SCAN TESTING

FIELD OF THE INVENTION

The present invention relates to circuitry which enables all connections to a device, including built-in self-test capability to be included in a scan chain for scan testing, and particularly but not exclusively to a memory storage device.

BACKGROUND TO THE INVENTION

Scan testing is a well established technique for checking the interconnections of integrated circuits, as well as for checking the functionality and performance of logic circuits. IEEE Standard 1149.1-1990 defines circuitry for scan testing.

A simple scan test is intended to check integrity of connections in an integrated circuit. This is achieved by feeding a scan chain of test information through the connections and ensuring that the correct information is scanned out.

However, certain blocks within integrated circuit devices do not lend themselves to full scan testing. For instance a memory device such as a RAM has data, address, and control inputs, and data output. However the data output is not directly linked to the data, address and control inputs. Thus in a scan test such a memory device is normally provided with circuitry such that the data input to the memory device can be bypassed directly to its data output. In this way the data input and output connections of the memory device can be scan tested, but there is no means for scan testing the control and address inputs of the memory device. The data input to the memory device will have the same width as the data output and therefore can be readily fed directly onto its memory data output in a scan test.

In such arrangements, the memory device itself is not tested during a scan test, but is tested in a separate built-in self-test (BIST). For this purpose a BIST controller is usually provided which generates test signals for the memory device on the data input, address and control signal lines, and checks that the correct data outputs are generated by the memory device. Specifically the BIST controller may write into the memory device particular bits of test patterns, and then read the test patterns to ensure that the test patterns read are those as written.

Thus there is a deficiency in the testing of integrated circuits including such memory devices, in that the although the memory device itself can be properly tested using a built in self-test, and the data input and data output connections can be tested using a scan test, there is no means for specifically testing the integrity of the connections of the control and address signal lines.

This deficiency in applying scan testing to integrated circuits is associated not only with addressed memory devices but also is associated generally with devices having a number of inputs greater than the number of outputs and in which there is no direct correlation between the inputs and the outputs. Such other devices, may include, for example a FIFO queue, or a stack that does not take an address but instead has an internal state to cope with addressing.

SUMMARY OF THE INVENTION

It is therefore an object of the present invention to provide circuitry which enables a device having a greater number of inputs than outputs, such as a device in an integrated circuit having built-in self-test capabilities, to be scan tested to check for the integrity of the connections of all signal lines.

According to the present invention there is therefore provided circuitry for scan testing a device having a plurality of inputs and at least one output, the number of inputs being greater than the number of outputs, comprising an exclusive-OR gate for receiving the plurality of inputs and for generating an exclusive-OR output, a multiplexer for receiving the at least one data output and the exclusive-OR output and selectively outputting one of such as a data output, wherein responsive to a scan test signal the multiplexer outputs the exclusive-OR output as the data output in a scan chain.

An additional problem arises in that the device under test may include a clocked element. In the scan test mode where the device is bypassed, such clocked element is thus removed from the scan path. If there is a combinatorial path from the output of a device under test to the input of the next level up of the circuit design hierarchy, then this could create a combinatorial loop during bypass mode that has the potential to oscillate and is detrimental to test coverage.

Therefore the invention also preferably provides circuitry in which the device includes at least one clocked element, and further comprising a scan latch for receiving as a data input the exclusive-OR output and providing as a data output a clocked exclusive-OR output to the multiplexer.

The invention also provides a method of scan testing a device having a plurality of inputs and at least one output, the number of inputs being greater than the number of outputs, comprising exclusive-ORing the inputs to generate an exclusive-OR output, selectively outputting one of the at least one output and the exclusive-OR output, wherein the exclusive-OR output is output responsive to a scan test signal.

BRIEF DESCRIPTION OF THE DRAWINGS

For a better understanding of the present invention and to show how the same may be carried into effect, reference will now be made by way of example to FIGS. 1 to 4 of the accompanying drawings, in which.

DESCRIPTION OF THE PREFERRED EMBODIMENT

In the following description the present invention is described with reference to an exemplary embodiment in which the device having a number of inputs greater than a number of outputs is an addressed memory device. It will be apparent, however, that the present invention is not limited to such an exemplary embodiment and is generally applicable to any device having a number of inputs greater than a number of outputs in a scan test environment.

Figure 1:
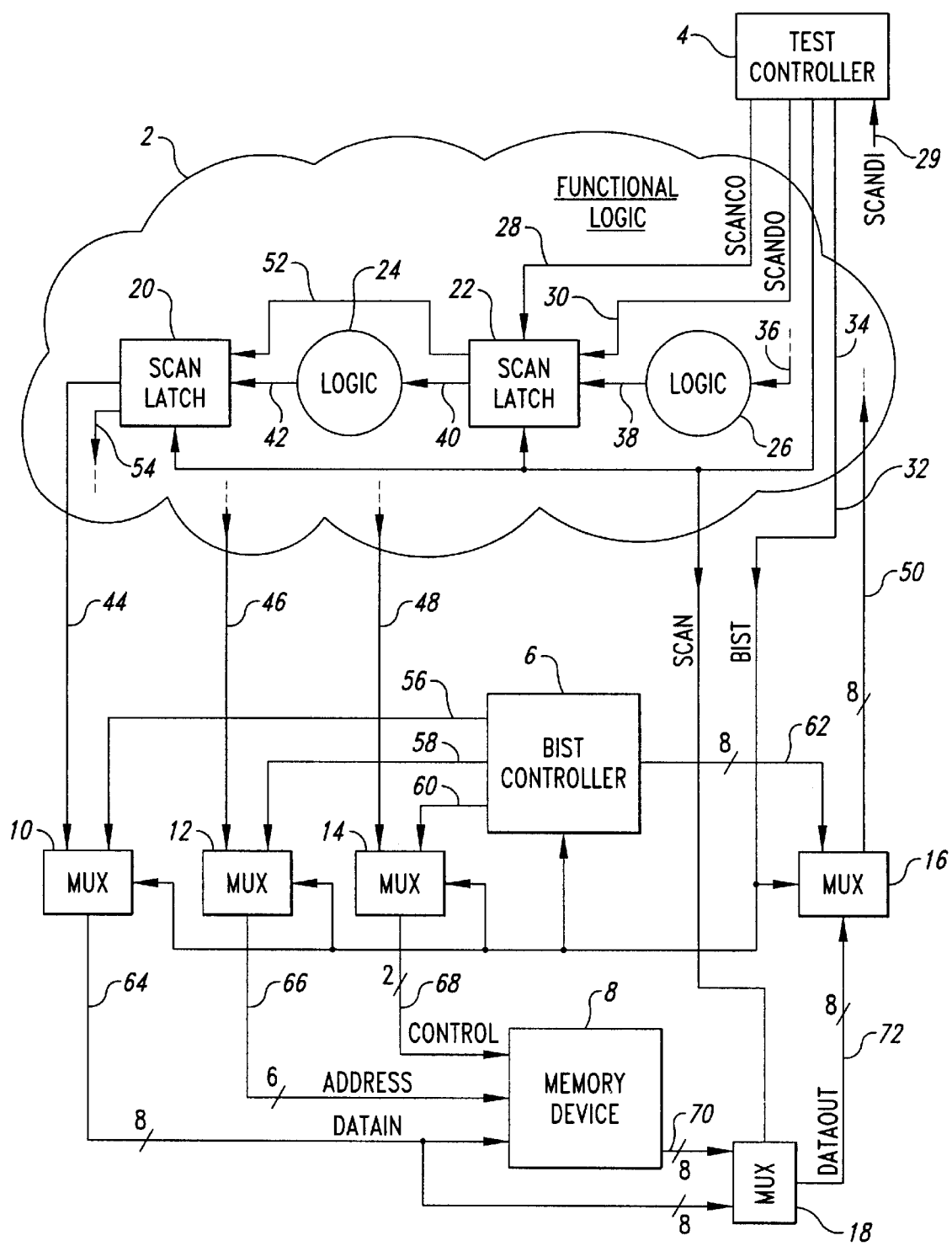
FIG. 1 is a block schematic diagram illustrating an integrated circuit under test including a memory device.

FIG. 1 illustrates a schematic diagram of an integrated circuit device including a memory element. The integrated circuit device includes functional logic generally designated as 2, and a memory device 8. The integrated circuit device is also provided with multiplexers 10, 12, 14, 16 and 18 for implementing test operations as will be described hereinafter.

A test controller 4 is provided for controlling the test operations performed on the integrated circuit. The test controller may include a TAP (test access port) controller in accordance with IEEE Standard 1149.1-1990. The test controller 4 may be provided on or off the integrated circuit.

As illustrated in FIG. 1, the functional logic 2 comprises blocks of combinational logic 24 and 26 and latches 20,22. The functional logic 2 may in fact include a plurality of such blocks of logic and latches. Thus the functional logic of the chip can be split up into blocks of combinational logic interspersed between latches or clocked elements. For the purpose of providing scan testing in accordance with IEEE Standard 1149.1-1990 each of the latches in the functional logic is replaced by a scan latch as indicated by elements 20 and 22. The scan latch provides the ability to operate as a normal latch during normal functional operation of the functional logic 2, and to enable scan testing in a scan test operation as will be described hereinafter.

The test controller 4 generates a signal indicating commencement of a built-in self-test BIST on line 34, a signal indicating commencement of a scan test SCAN on line 32, a scan data output SCANDO on line 30, and scan control signals SCANCO on lines 28. The test controller 4 also receives a scan data input signal SCANDI on line 29 from the functional logic. The test controller 4 may receive and generate other test control signals as will be well understood by one skilled in the art. The logic block 26 receives an input signal on line 36 from somewhere within the integrated circuit, or possibly from off chip. The logic block 26 generates an output signal on line 38 to scan latch 22. Scan latch 22 generates an output signal on line 40 to logic block 24, which in turn generates on output on line 42 to scan latch 20. Scan latch 20 generates a data output on line 44. The scan latch 22 also receives the signal SCANDO on line 30 from the test controller 4, outputs its own scan output on line 52 which is input to the scan latch 20, the scan latch 20 in turn outputting a scan output on line 54 which will be connected to other circuitry within the functional logic 2, or possibly connected directly to the scan data input signal SCANDI on line 29 to the test controller 4. The scan control signals SCANCO on line 28 are input to the scan latches 20 and 22 to control scan testing operations, and the scan latches 20 and 22 also receive the signal SCAN on line 32.

The functional logic 2 generates data signals on lines 44, address signals on line 46 and control signals on line 48 to the memory device 8 in normal operation. Each of these data, address and control signals forms one of two inputs to each of the respective multiplexers 10, 12 and 14. The BIST controller 6 generates test data, address and control signals on lines 56, 58 and 60 respectively to alternate inputs of each of the multiplexers 10, 12 and 14. The multiplexers 10, 12 and 14 are controlled by the signal BIST to output one of their respective sets of inputs on the respective output lines 64, 66 and 68. The output 64 of the multiplexer 10 forms the data input signals DATAIN to the memory device 8, the outputs on line 66 from the multiplexer 12 form the address input ADDRESS to the memory device 8, and the outputs on lines 68 from the multiplexer 14 form the control inputs CONTROL to the memory device 8. For the purposes of this exemplary embodiment, the data input DATAIN to the memory device 8 is 8 bits wide, the address input address is 6 bits wide, and the control input control is 2 bits wide. The data input DATAIN on line 64 also forms one input to the multiplexer 18. The other input of the multiplexer 18 is provided by the data output of the memory device 8 on line 70. The multiplexer 18 is controlled by the signal SCAN on line 32 to select one of its two inputs for output as the output data DATAOUT on line 72 which forms an input to the multiplexer 16. The multiplexer 16 is controlled by the signal BIST to connect the output data DATAOUT on line 72 to either the BIST controller 6 via line 62 or to the functional logic 2 via lines 50.

The integrated circuit shown in FIG. 1 has three modes of operation: normal functional mode, scan test mode, and built-in self-test mode.

In normal functional mode, neither of the signals SCAN or BIST are set, as such the scan latches 20 and 22 in the functional logic operate as normal latches to clock data therethrough. Although no clock signals are shown in FIG. 1 it will be appreciated by one skilled in the art that all clocked devices such as the scan latches 20 and 22 and the BIST controller 6 will receive a system clock signal. The multiplexers 10, 12 and 14 are controlled, by the signal BIST not being set, to output the respective inputs on lines 44, 46, and 48 to the output 64, 66 and 68. The multiplexer 18 is controlled by the signal SCAN not being set to output the signals on line 70 as the output data DATAOUT on line 72, and the multiplexer 16 is controlled by the BIST not being set to output the output data DATAOUT on line 50 to the functional logic. Thus the functional logic 2 addresses the memory device 8 in a standard way to read and write data therefrom.

In a built-in self-test mode, the test controller 4 sets the signal BIST on line 34 which initiates the BIST controller 6 to commence a built-in self-test operation. The BIST signal switches the multiplexers 10, 12 and 14 such that the signals on lines 56, 58 and 60 are output on lines 64, 66 and 68 of the memory device 8. The multiplexer 16 is switched such that the data output DATAOUT on line 72 is connected to the line 62 and input to the BIST controller 6. The multiplexer 18 remains connected by the signal SCAN not being set such that the signals on line 70 are connected to the signals on line 72. The BIST controller 6 then commences a standard test operation of the memory device 8, by writing test patterns to the memory device 8 and reading the written test patterns therefrom. The data read from the memory device 8 and received by the BIST controller 6 on line 62 is compared for an expected result. In this way the functionality of the memory device 8 is fully tested. If, however, an error is detected during the built-in self-test, then such fault may lie with the memory device 8, with the BIST controller 6 itself, or with the interconnections surrounding the BIST controller and the memory device 8.

For the purpose of testing the interconnections not only of the BIST controller and memory device 8 but also those of the functional logic 2, the scan test is provided. A scan test is initiated by the test controller 4 setting the signal SCAN on line 32. In a scan test mode the signal BIST is not set, therefore the multiplexers 10, 12 and 14 connect their inputs on lines 44, 46 and 48 to their outputs on lines 64, 66 and 68 respectively, and the multiplexer 16 connects the signals on line 72 to the signals 50. The signal SCAN being set switches the multiplexer 18 such that the input data DATAIN on line 64 is output to the output data DATAOUT on line 72. In the scan test mode, the test controller 4 outputs on the scan data output line 30 serial bits of data to be shifted through the scan chain comprised by scan latches 20, 22 and other scan latches. Such test data is clocked through along the lines 30, 52 and 54 between the various scan latches 20 and 22. A simple scan test merely shifts such data through all the scan latches of the integrated circuit and returns it to the test controller 4 as the scan data input signal SCANDI on line 29. Test controller 4 then determines whether the data scanned back in matches the data scanned out. Any discrepancy indicates a fault.

A slightly more useful scan test is to test the actual functional integrity of the logic on the integrated circuit. In this functional scan test, a serial scan pattern is scanned through the scan latches 20 and 22 as before. However, once the full scan pattern has been scanned into the scan latches, the scan latches are controlled by control signals SCANCO to "update" their data outputs. Thus, for instance referring to scan latch 22, in response to an "update" operation a scan test bit on the scan input 30 to scan latch 22 appears on the data output 40 of scan latch 22 and is input to the logic 24. On the next clock cycle the scan latch 20 "captures" the output of the logic 24 on its data input 42. The thus "captured" data output is then returned in the scan chain via scan output 54 of the scan latch 20 to the test controller 4. Thus in this operation the test controller 4 can test to see whether the results achieved by the logic blocks 24 and 26 are those as expected. Thus this functional scan test tests not only the integrity of the interconnections of the integrated circuit, but also the functionality of the logic blocks of the integrated circuit. As will be seen, in such a scan test the link provided by the signal lines 44, 64, 72 and 50 provides part of the scan chain, and therefore any fault in the connections therebetween will be detected by the test controller 4. However, it will be clear that the signal lines 66 and 68 do not form part of the scan chain.

Figure 2:
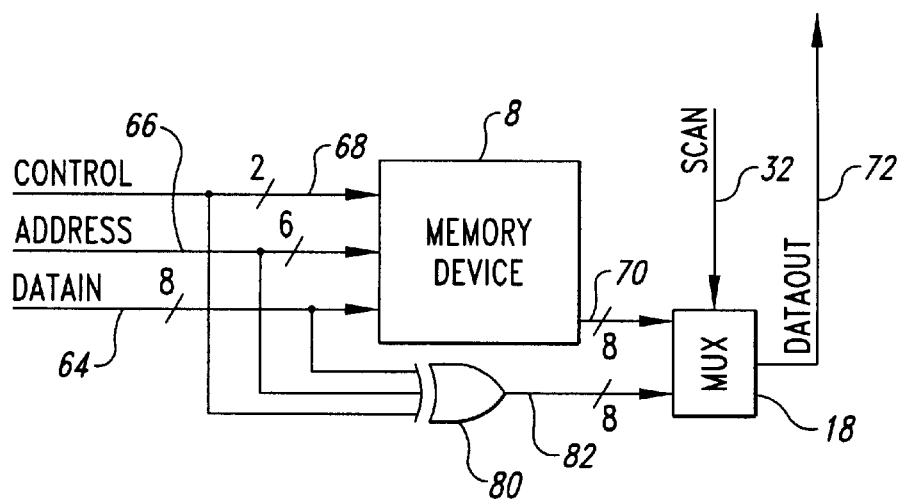
FIG. 2 is a block diagram of circuitry for enabling all connections of the memory device to be scan tested in accordance with one exemplary implementation of the present invention.

Referring now to FIG. 2, there is shown a modification to the circuitry of FIG. 1 which enables the control and address signals to the memory device 8 to be included as part of the scan chain. Only those elements of FIG. 1 which are required to enable the invention to be described are shown in FIG. 2. In addition, like reference numerals are used in FIG. 2 to indicate elements which are the same as those shown in FIG. 1.

In order to enable the control and address signals input to the memory device 8 to be scan tested to improve coverage of the scan test on the integrated circuit, an exclusive-OR gate 80 is provided at the second input to the multiplexer 18. As illustrated in FIG. 2, each of the signals on lines 68, 66 and 64 form inputs to the exclusive-OR gate 80. The output of the exclusive-OR gate 80. The output of the exclusive-OR gate 80 on line 82 performs the second input to the multiplexer 18 instead of the input data DATAIN on line 64 as shown in FIG. 1. The output of the exclusive-OR gate 80 on line 82 will be 8 bits wide to form the appropriate input to the multiplexer 18. Therefore each bit of the input data signal on line 64 is exclusive-ORed with at least one bit of either the address signal ADDRESS or control signal CONTROL on lines 66 and 68 respectively. In the present invention as the address is 6 bits wide and the control signals are 2 bits wide, each bit of the address can be exclusive-ORed with 6 bits of the input data signal, and the other 2 bits of the input data signal can be exclusive-ORed with the 2 bits of the control signal CONTROL. Thus each of the 8 outputs on signal line 82 of the exclusive-OR gate is an exclusive-OR of 2 respective inputs. A change on either one of the inputs will cause a change of the respective output.

Thus, in a scan test mode, the scan test pattern can be generated so as to generate different bits on the input data signal line 64 which does form part of the scan chain. In response to changing the bits on the input data signal, the outputs of the exclusive-OR gate 80 should change. However, they will not change if either of the control or address signals on lines 68 and 66 are also changing, indicating a fault. Thus by provision of the exclusive-OR gate 80 as shown in FIG. 2 all the interconnections surrounding the memory device 2 can be scan tested.

Figure 3:
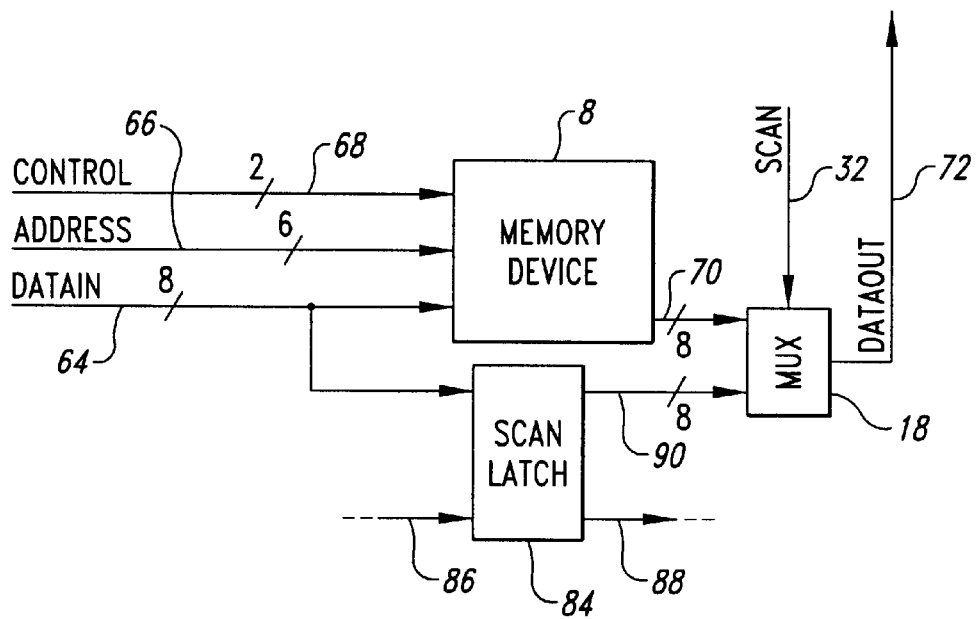
FIG. 3 is a block diagram illustrating circuitry for enabling a memory device to be scan tested when the memory device includes a clocked element.

Referring back to FIG. 1, a further problem arises in the scan test if the memory device 8 itself includes a clocked element. If the memory device 8 includes a clocked element then there are inputs which are not transparent to the outputs. In the scan test mode, where the memory device is bypassed, the clocked element of the memory device 8 is taken out of the normal circuit path. If there is a combinatorial path from the output 50 back to the input 44 at the next level of the design hierarchy, then this could create a combinatorial loop during bypass mode that has the potential to oscillate and is detrimental to test operation. To eliminate this problem, a scanned flip-flop can be included in the bypass of the memory device 8 as illustrated in FIG. 3. In FIG. 3, the same reference numerals are used to illustrate devices which are shown in FIGS. 1 or 2.

As can be seen in FIG. 3, the problem caused by having a clocked element in the memory device 8 is overcome by placing a scan latch 84 at the second input of the multiplexer 18. Thus the input data DATAIN to the memory device 8 forms an input to the scan latch 84, the output of the scan latch 84 on line 90 forming the second input to the multiplexer 18 in place of the input data on line 64 itself, as shown in FIG. 1. The input data on line 64 forms a data input to the scan latch and the output 90 is the data output of the scan latch. The scan latch 84 also has a scan input 86 and a scan output 88. The scan input 86 receives the scan output of a different scan latch in a scan chain, for example the output 54 of scan latch 20. The scan output 88 of the scan latch 84 forms a scan input to another scan latch in the scan chain, or alternatively may form directly the scan data input SCANDI on line 29 to the test controller 4. The scan latch 84 operates in exactly in the same way as the scan latches 20 and 22 as the functional logic 2 as described hereinabove.

Figure 4:
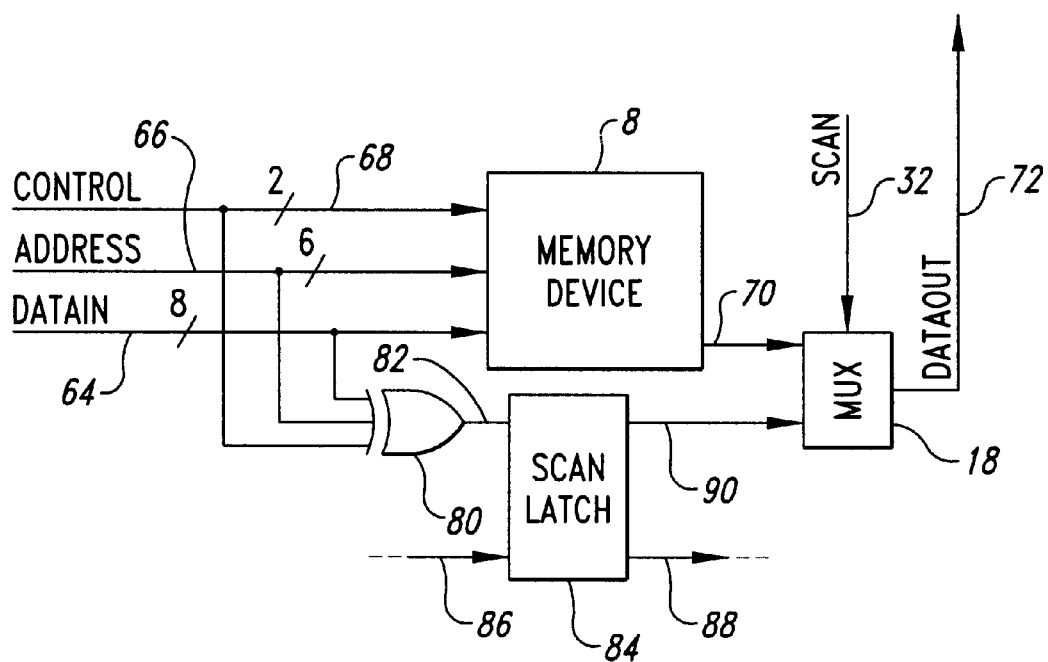
FIG. 4 illustrates circuitry for enabling all connections of a memory device to be scan tested when the memory device includes a clocked element in accordance with an embodiment of the present invention.

FIG. 4 shows the combination of the circuits of FIGS. 2 and 3 in which both the exclusive OR-gate 80 and the scan latch 84 are provided so as to ensure full scan coverage of the interconnections to the memory device 8 without the problem associated with possible oscillations introduced by clocked elements in the memory device 8.

What is claimed is:

1. Circuitry for scan testing a device having a plurality of inputs and at least one output, the number of inputs being greater than the number of outputs, the device including at least one clocked element, the circuitry comprising:

an exclusive-OR gate for receiving the plurality of inputs and for generating an exclusive-OR output;

a scan latch for receiving as a data input the exclusive-OR output and providing as a data output a clocked exclusive-OR output; and a multiplexer for receiving the at least one data output and the clocked exclusive-OR output from the scan latch and selectively outputting one of such as a data output, wherein responsive to a scan test signal the multiplexer outputs the clocked exclusive-OR output as the data output in a scan chain.

2. Circuitry according to claim 1 in which the device has a plurality of outputs, and the exclusive-OR gate generates a plurality of exclusive-OR outputs equal in number to the plurality of outputs.

3. Circuitry according to claim 1 in which the device is a storage device.

4. Circuitry according to claim 3 in which the device is an addressed storage device.

5. Circuitry according to claim 1 in which the plurality of inputs includes at least data and address inputs, and the at least one output is a data output.

6. Circuitry according to claim 5 in which the data input and address input each comprise a plurality of bits, and the exclusive-OR gate exclusive-ORs each bit of the address input with a bit of the data input, and wherein the data output comprises a plurality of bits equal in number to the data input.

7. Circuitry according to claim 1 in which the device has a control input, the control input comprising a further input to the exclusive-OR gate.

8. Circuitry according to claim 6, wherein the plurality of inputs includes a control input having at least one bit which is exclusive-ORed with a bit of the data input.

9. A method of scan testing a device including at least one clock element and having a plurality of inputs and at least one output, the number of inputs being greater than the number of outputs, the method comprising:

exclusive-ORing the inputs to generate an exclusive-OR output;

latching the exclusive-OR output and providing a clocked exclusive-OR output;

selectively outputting one of the at least one output and the clocked exclusive-OR output, wherein the clocked exclusive-OR output is output responsive to a scan test signal.

10. The method of claim 9 wherein the latching step is performed in a scan latch.

* * * * *